(12) United States Patent
Du et al.

(10) Patent No.: US 12,035,545 B2
(45) Date of Patent: Jul. 9, 2024

(54) OLED PANEL, HAVING CATHODE DISPOSED ON PIXEL OPENING EVAPORATION METHOD THEREOF, AND MASK PLATE GROUP THEREOF HAVING MASK PLATE CORRESPONDING TO PIXEL OPENING

(71) Applicant: WUHAN CHINA STAR OPTOELECTRONICS SEMICONDUCTOR DISPLAY TECHNOLOGY CO., LTD., Hubei (CN)

(72) Inventors: Xiao Du, Hubei (CN); Hyangshik Kong, Hubei (CN); Munjae Lee, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 939 days.

(21) Appl. No.: 16/982,263

(22) PCT Filed: Jun. 9, 2020

(86) PCT No.: PCT/CN2020/095124
§ 371 (c)(1),
(2) Date: Sep. 18, 2020

(87) PCT Pub. No.: WO2021/139085
PCT Pub. Date: Jul. 15, 2021

(65) Prior Publication Data
US 2022/0020928 A1    Jan. 20, 2022

(30) Foreign Application Priority Data
Jan. 6, 2020 (CN) .......................... 202010008432.2

(51) Int. Cl.
*H10K 71/00* (2023.01)
*C23C 14/04* (2006.01)
(Continued)

(52) U.S. Cl.
CPC ......... *H10K 71/621* (2023.02); *C23C 14/042* (2013.01); *C23C 14/24* (2013.01);
(Continued)

(58) Field of Classification Search
CPC .... H10K 71/621; H10K 50/822; H10K 71/00; H10K 2102/00; H10K 2102/351;
(Continued)

(56) References Cited

U.S. PATENT DOCUMENTS 7,868,330 B2 * 1/2011 Lee ...................... H10K 50/814
257/E21.045
8,963,417 B2 * 2/2015 Yokoyama ........... H10K 50/813
313/504
(Continued)

FOREIGN PATENT DOCUMENTS

CN    108517490 A    9/2018
CN    109786582 A    5/2019
(Continued)

*Primary Examiner* — Caleb E Henry (57) ABSTRACT

A mask plate group of an organic light emitting diode (OLED) panel, a cathode evaporation method thereof and an OLED panel are provided. The OLED panel includes a display area having an imaging area, and the mask plate group includes a first mask plate and a second mask plate. The first mask plate includes a common mask opening area. The common mask opening area covers an entire of the display area. The second mask plate includes a special-shaped mask opening area. The special-shaped mask opening area covers all the display area except the imaging area.

18 Claims, 7 Drawing Sheets

(51) Int. Cl.
*C23C 14/24* (2006.01)
*H10K 50/822* (2023.01)
*H10K 102/00* (2023.01)

(52) U.S. Cl.
CPC ........... *H10K 50/822* (2023.02); *H10K 71/00* (2023.02); *H10K 2102/00* (2023.02); *H10K 2102/351* (2023.02)

(58) Field of Classification Search
CPC .... H10K 71/60; H10K 71/166; C23C 14/042; C23C 14/24; C23C 14/12
See application file for complete search history.

(56) References Cited

U.S. PATENT DOCUMENTS

| | | | |
|---|---|---|---|
| 9,818,970 B2 * | 11/2017 | Wu | H10K 50/85 |
| 2012/0129107 A1 | 5/2012 | Kim et al. | |
| 2012/0268000 A1 * | 10/2012 | Choi | H10K 50/828 |
| | | | 313/504 |
| 2013/0234129 A1 * | 9/2013 | Yamada | H05B 33/22 |
| | | | 438/35 |
| 2015/0303399 A1 * | 10/2015 | Cui | H10K 71/166 |
| | | | 430/5 |
| 2015/0372257 A1 * | 12/2015 | Zhang | H10K 71/00 |
| | | | 257/40 |
| 2016/0260923 A1 * | 9/2016 | Wu | H10K 50/852 |
| 2018/0040855 A1 * | 2/2018 | Chen | H10K 71/00 |
| 2018/0261798 A1 * | 9/2018 | Choi | H10K 50/824 |
| 2019/0019954 A1 * | 1/2019 | Zhang | H10K 71/166 |
| 2019/0067393 A1 | 2/2019 | Hiraga | |
| 2019/0131585 A1 * | 5/2019 | Yang | H10K 71/00 |

FOREIGN PATENT DOCUMENTS

| | | |
|---|---|---|
| CN | 109920931 A | 6/2019 |
| CN | 109957754 A | 7/2019 |
| CN | 110444125 A | 11/2019 |
| CN | 110473988 A | 11/2019 |
| CN | 110518034 A | 11/2019 |
| CN | 111155055 A | 5/2020 |
| JP | 2007103098 A | 4/2007 |
| KR | 20180041294 A | 4/2018 |

* cited by examiner

OLED PANEL, HAVING CATHODE DISPOSED ON PIXEL OPENING EVAPORATION METHOD THEREOF, AND MASK PLATE GROUP THEREOF HAVING MASK PLATE CORRESPONDING TO PIXEL OPENING

FIELD OF INVENTION

The present disclosure relates to the field of display technologies, and more particularly to an organic light emitting diode (OLED) panel, an evaporation method thereof, and a mask plate group thereof.

BACKGROUND OF INVENTION

In recent years, the development of a mobile terminal market has stimulated an advancement of new display technologies. In order to meet needs of large screen display and high screen ratio of mobile terminals, the mobile phone industry introduced a comprehensive screen concept, which is intended to increase a screen ratio of mobile phone screens. In order to achieve an ideal full-screen display status, relevant practitioners around the world have conducted many theoretical and practical explorations. Among them, under-screen fingerprint identification systems have been mass-produced, and under-screen cameras and under-screen calling functions are still under development. In the prior art, assembly of a mobile phone call module and a camera module requires a corresponding position on a side of a mobile phone screen, therefore, many new full-screen mobile phones are provided with a notch at a top of the screen to place the call module and the camera module, such as PHONE XS and Huawei P20 series. There is also opening in a camera area, such as Samsung S10 series. Because a manufacturing process uses laser to cut off a display area, for example, a part area of an active area (AA). Therefore, a width of a border of the opening needs to be wider, to prevent laser cutting from exposing a cross section of the display area to affect an performance of the panel. The panel produced by this design can increase a screen ratio of a terminal product, but a notch and a hole area are still relatively abrupt to an appearance of the product. This type of design still occupies a considerable display area, which is still quite different from the idea of a real full screen.

In order to achieve a relatively real under-screen camera design, terminal designers try to improve the design of mobile phone modules, such as OPPO FIND X, VIVO NEX mobile phones, etc. Such designs increase complexity of mobile phone manufacturing and risk of damage. Now the display industry has combined transparent display related experience to design transparent panels to achieve a design of coexistence of display and under-screen modules.

Unlike transparent displays that have been developed in the past, OLED panels used in mobile phone panels are top-emitting OLED devices. For top-emitting devices, factors that most affect transmittance are polyimide (PI) substrates, thin film transistor (TFT) metal traces, and emissive layer cathode (EL cathode). However, the PI substrate can be replaced with a transparent polyimide (CPI) substrate to increase penetration. TFT metal traces can be stacked. A method of improving transmittance of a cathode of an emissive layer can only try to reduce a thickness of some regions. An anode in the top-emitting device is composed of ITO/Ag/ITO, and it can form a microcavity effect with a cathode film layer on an uppermost layer of an EL layer to enhance light-emitting efficiency of an EL device. Thinning a cathode of a pixel light-emitting area cannot improve transmittance of this part but will have a greater impact on efficiency of the OLED device.

Therefore, there is a need to provide an OLED panel, an evaporation method thereof, and a mask plate group thereof to solve issues in the prior art.

SUMMARY OF INVENTION

In order to solve the above technical problems, an object of the present disclosure is to provide an OLED panel, an evaporation method thereof, and a mask plate group thereof, which can increase transmittance of an imaging area.

To achieve the above object, an embodiment of the present disclosure provides a mask plate group of an organic light emitting diode (OLED) panel. The OLED panel comprises a display area having an imaging area. The mask plate group comprises a first mask plate and a second mask plate. The first mask plate comprises a common mask opening area. The common mask opening area covers an entire of the display area. The second mask plate comprises a special-shaped mask opening area. The special-shaped mask opening area covers all the display area except the imaging area.

In an embodiment of the present disclosure, the mask plate group of the OLED panel further comprises a third mask plate comprising a precision mask area, the precision mask area covers an entire of the imaging area, and an opening of the precision mask area corresponds to a pixel opening of the imaging area.

In an embodiment of the present disclosure, the third mask plate further comprises a third mask plate masking area and a third mask frame, the precision mask area and the third mask plate masking area are alternately arranged, the third mask frame carries the third mask plate masking area, and a boundary of the precision mask area is greater than a boundary of the display area.

In an embodiment of the present disclosure, the boundary of the precision mask area extends 5 μm to 500 μm toward the boundary of the display area.

In an embodiment of the present disclosure, a thickness of the first mask plate, a thickness of the second mask plate, and a thickness of the third mask plate range from 0.01 mm to 0.2 mm.

In an embodiment of the present disclosure, the first mask plate further comprises a first mask plate masking area and a first mask frame, the common mask opening area and the first mask plate masking area are arranged alternately, the first mask frame carries the first mask plate masking area, and an area of the common mask opening area is greater than an area of the entire of the display area.

In an embodiment of the present disclosure, a size of the common mask opening area extends 5 μm to 500 μm to all boundaries of the display area.

In an embodiment of the present disclosure, the second mask plate further comprises a second mask plate masking area and a second mask frame, the special-shaped mask opening area and the second mask plate masking area are alternately arranged, the second mask frame carries the second mask plate masking area, and three boundaries of the special-shaped mask opening area are greater than three boundaries of the display area.

In an embodiment of the present disclosure, the three boundaries of the special-shaped mask opening area extend 5 μm to 500 μm toward the three boundaries of the display area.

An embodiment of the present disclosure further provides an evaporation method of an OLED panel comprising performing a first evaporation process and a second evaporation process of a cathode of the OLED panel using a first mask plate and a second mask plate in different orders on the same substrate, wherein the first mask plate comprises a common mask opening area, the common mask opening area covers an entire of a display area, the second mask plate comprises a special-shaped mask opening area, and the special-shaped mask opening area covers all the display area except an imaging area.

In an embodiment of the present disclosure, the evaporation method of the OLED panel further comprises after performing the first evaporation process and the second evaporation process, using a third mask plate to perform a third evaporation process of the cathode of the OLED panel, wherein the third mask plate comprises a precision mask area, the precision mask area covers an entire of the imaging area, and an opening of the precision mask area corresponds to a pixel opening of the imaging area.

In an embodiment of the present disclosure, the first evaporation process comprises using the first mask plate to vaporize a first cathode having a first thickness in the entire of the display area having the imaging area of the OLED panel; the second evaporation process comprises using the second mask plate to vaporize a second cathode having a second thickness in all the display area except the imaging area of the OLED panel, a thickness of the cathode in the imaging area is less than a thickness of the cathode in all the display area except the imaging area; and the third evaporation process comprises using the third mask plate to vaporize a third cathode having a third thickness in the pixel opening of the imaging area of the OLED panel.

In an embodiment of the present disclosure, a sequence of the first evaporation process is earlier than a sequence of the second evaporation process.

In an embodiment of the present disclosure, a sequence of the second evaporation process is earlier than a sequence of the first evaporation process.

In an embodiment of the present disclosure, the evaporation method of the OLED panel further comprises using three different sheets of the first mask plate, the second mask plate, and the third mask plate to vaporize different areas of the display area at least three times, wherein the first thickness of the first cathode in the first evaporation process ranges from 50 Å to 120 Å, the second thickness of the second cathode in the second evaporation process ranges from 20 Å to 130 Å, the third thickness of the third cathode in the third evaporation process ranges from 20 Å to 130 Å, a thickness of the cathode of all the display area except the imaging area ranges from 70 Å to 250 Å, a thickness of the cathode of a non-pixel opening area of the imaging area of the display area ranges from 50 Å to 120 Å, and a thickness of the cathode of the pixel opening of the imaging area ranges from 70 Å to 250 Å.

An embodiment of the present disclosure provides an OLED panel comprising a cathode structure. The cathode structure comprises a display area having an imaging area, a first cathode having a first thickness fully disposed on the display area, and a second cathode having a second thickness disposed on all the display area except the imaging area.

In an embodiment of the present disclosure, the cathode structure of the OLED panel further comprises a third cathode having a third thickness disposed on the pixel opening of the imaging area.

In an embodiment of the present disclosure, the first thickness of the first cathode ranges from 50 Å to 120 Å, the second thickness of the second cathode ranges from 20 Å to 130 Å, and the third thickness of the third cathode ranges from 20 Å to 130 Å.

In an embodiment of the present disclosure, a thickness of the cathode of all the display area except the imaging area ranges from 70 Å to 250 Å, a thickness of the cathode of a non-pixel opening area of the imaging area of the display area ranges from 50 Å to 120 Å, and a thickness of the cathode of the pixel opening of the imaging area ranges from 70 Å to 250 Å.

In an embodiment of the present disclosure, material of the cathode structure is composed of Ag/Mg alloy in different ratios, and a ratio of Mg content to the Ag/Mg alloy ranges from 0% to 95%.

Beneficial Effect:

Beneficial effect of embodiments of the present invention: In an OLED panel, an evaporation method thereof, and a mask plate group thereof, the mask plate group comprises a first mask plate and a second mask plate. The first mask plate comprises a common mask opening area. The common mask opening area covers an entire of the display area. The second mask plate comprises a special-shaped mask opening area. The special-shaped mask opening area covers all the display area except the imaging area. The evaporation method of the OLED panel comprises performing a first evaporation process and a second evaporation process of a cathode of the OLED panel using a first mask plate and a second mask plate in different orders on the same substrate. The first mask plate is the first mask plate as described above, and the second mask plate is the second mask plate as described above. The cathode structure of the OLED panel comprises a display area having an imaging area, a first cathode having a first thickness fully disposed on the display area, and a second cathode having a second thickness disposed on all the display area except the imaging area. The embodiments of the present disclosure can increase transmittance of the imaging area.

In order to make the above contents of the present disclosure more obvious and understandable, the preferred embodiments are described below in conjunction with the attached drawings, which are described in detail as follows:

DESCRIPTION OF DRAWINGS

In order to explain the technical solution in the embodiments or the prior art more clearly, the accompanying drawings used in the description of the embodiments or the prior art will be briefly introduced below. Obviously, the drawings in the following description are only some embodiments of the present invention. For those of ordinary skill in the art, other drawings can be obtained according to the drawings without paying creative efforts.

DETAILED DESCRIPTION OF PREFERRED EMBODIMENTS

The following descriptions of the embodiments are made with reference to additional illustrations to illustrate specific embodiments in which the present invention can be implemented. The directional terms mentioned in the present invention, such as up, down, top, bottom, front, back, left, right, inside, outside, side, peripheral, central, level, horizontal, vertical, longitudinal, axial, radial, highest layer, or lowest layer, etc., are only directions referring to the accompanying drawings. Therefore, the directional terms used are for explaining and understanding the present invention, but not for limiting the present invention.

In the figures, similarly structured units are denoted by the same reference numerals.

Figure 1:
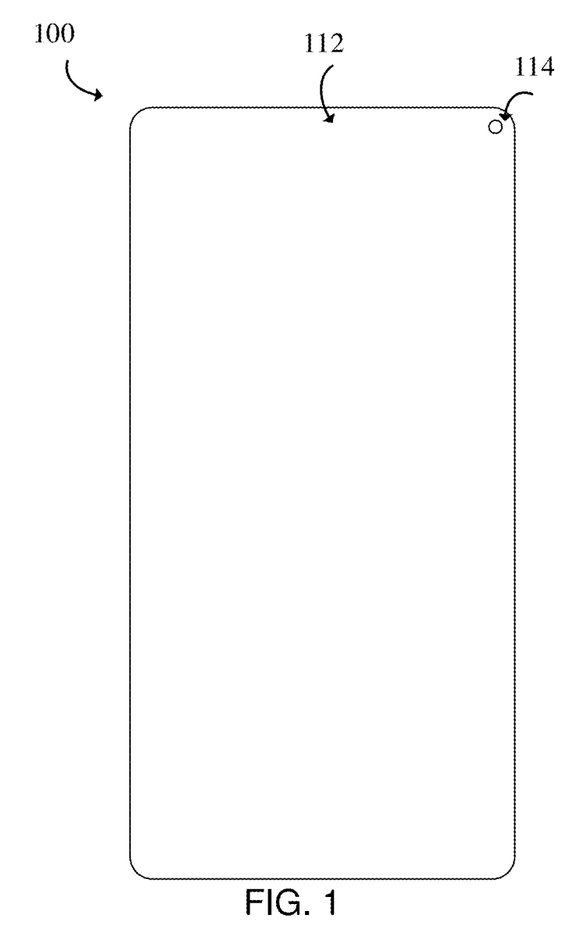
FIG. 1 is a schematic structural diagram of an OLED panel according to an embodiment of the present disclosure.
Figure 2:
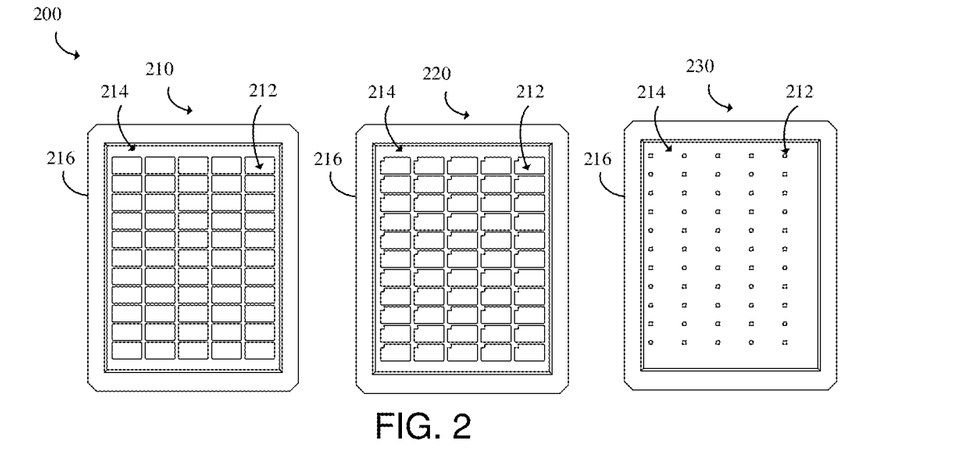
FIG. 2 is a schematic structural diagram of a mask plate group of an OLED panel according to an embodiment of the present disclosure.

Referring to FIG. 1 and FIG, 2, FIG. 1 is a schematic structural diagram of an OLED panel according to an embodiment of the present disclosure, and FIG. 2 is a schematic structural diagram of a mask plate group of an OLED panel according to an embodiment of the present disclosure. In an embodiment of the present disclosure, an OLED panel 100 comprises a display area 110 having an imaging area 112, such as an active area (AA). A mask plate group 200 comprises a first mask plate 210 and a second mask plate 220. The first mask plate 210 comprises a common mask opening area 212. The common mask opening area 212 covers an entire of the display area 110. The second mask plate 220 comprises a special-shaped mask opening area 222. The special-shaped mask opening area 222 covers all the display area 110 except the imaging area 112. The embodiments of the present disclosure can increase transmittance of the imaging area 112.

In an embodiment of the present disclosure, the mask plate group 200 further comprises a third mask plate 230 comprising a precision mask area 232, the precision mask area 232 covers an entire of the imaging area 112, and an opening of the precision mask area 232 corresponds to a pixel opening of the imaging area 112.

In details, in an embodiment of the present disclosure, the first mask plate 210 further comprises a first mask plate masking area 214 and a first mask frame 216, the common mask opening area 212 and the first mask plate masking area 214 are arranged alternately, the first mask frame 216 carries the first mask plate masking area 214, and an area of the common mask opening area 212 is greater than an area of the entire of the display area 110. In details, in an embodiment of the present disclosure, a size of the common mask opening area 212 extends to all boundaries of the display area 110 by 5 μm to 500 μm. The first mask plate masking area 214 is fixed on the first mask frame 216 by laser spot welding, and a size of the first mask frame 216 is determined by a size of the first mask plate masking area 214.

Figure 3:
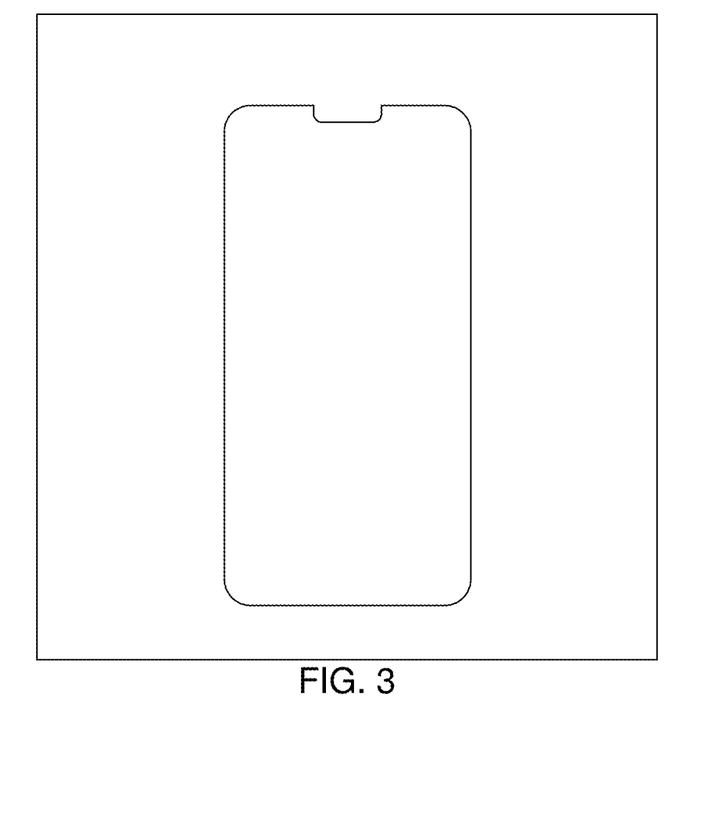
FIG. 3 is a schematic structural diagram of a second mask plate according to an embodiment of the present disclosure.
Figure 4:
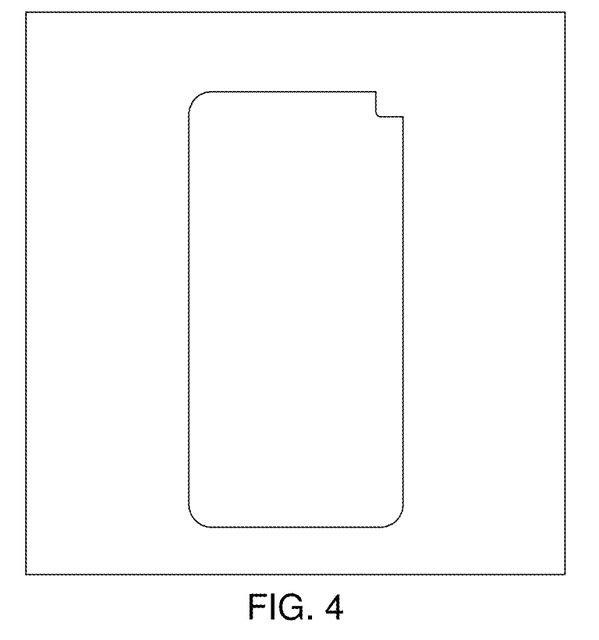
FIG. 4 is a schematic structural diagram of a second mask plate according to an embodiment of the present disclosure.
Figure 5:
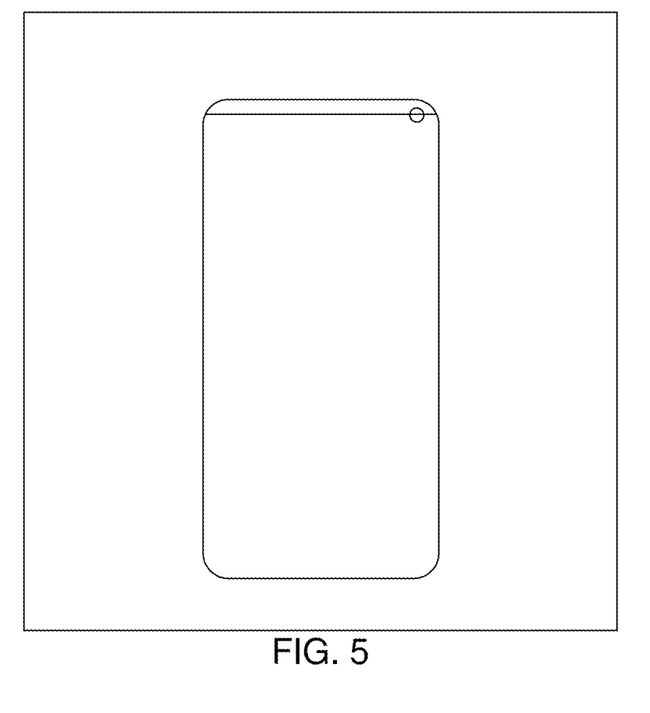
FIG. 5 is a schematic structural diagram of a second mask plate substrate according to an embodiment of the present disclosure.

In details, in an embodiment of the present disclosure, the second mask plate 220 further comprises a second mask plate masking area 224 and a second mask frame 226, the special-shaped mask opening area 222 and the second mask plate masking area 224 are alternately arranged, the second mask frame 226 carries the second mask plate masking area 224, and three boundaries of the special-shaped mask opening area 222 are greater than three boundaries of the display area 110. In details, in an embodiment of the present disclosure, the three boundaries of the special-shaped mask opening area 222 extend 5 μm to 500 μm toward the three boundaries of the display area 110. The second mask plate masking area 224 is fixed on the second mask frame 226 by laser spot welding. A size of the second mask frame 226 is determined by a size of the second mask plate masking area 224. Specifically, in an embodiment of the present disclosure, a shielding scheme of the second mask plate 220 depends on the specific design. The size and position of the special-shaped mask opening area 222 are determined by the opening of an under-screen module of the display area 110. The the special-shaped mask opening area 222 can be completely covered. Designs such as a top notch, panel notch at a corner of the panel, and a bridging round shadow area can be used but are not limited to them, as shown in FIG. 3, FIG. 4, and FIG. 5.

Figure 6:
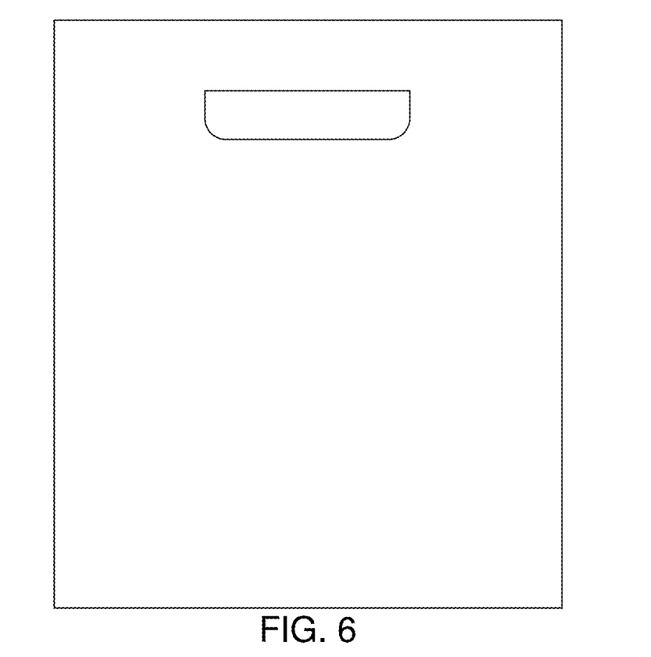
FIG. 6 is a schematic structural diagram of a third mask plate according to an embodiment of the present disclosure.
Figure 7:
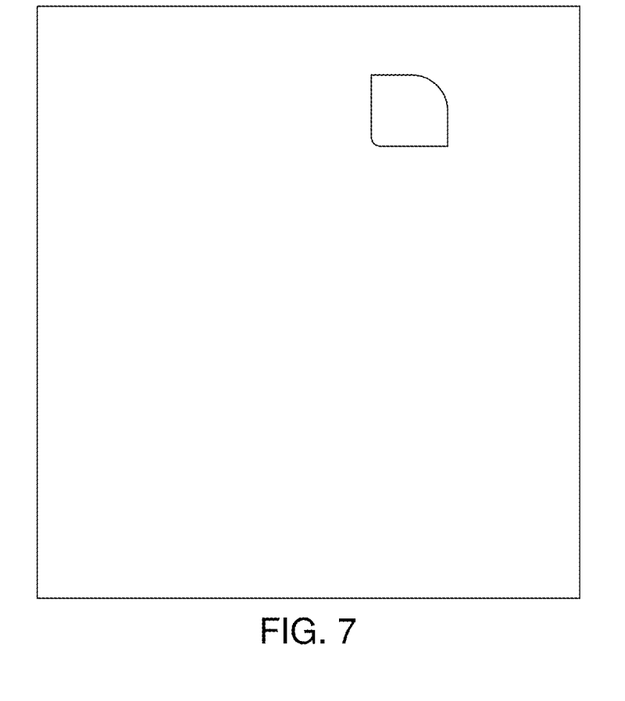
FIG. 7 is a schematic structural diagram of a third mask plate according to an embodiment of the present disclosure.
Figure 8:
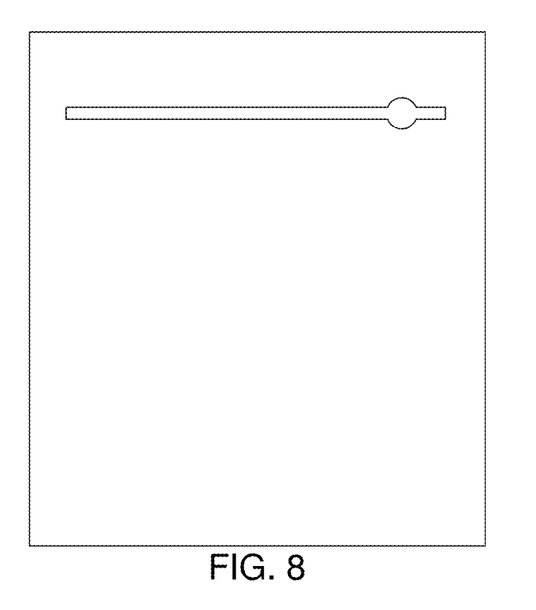
FIG. 8 is a schematic structural diagram of a third mask plate according to an embodiment of the present disclosure.

In details, in an embodiment of the present disclosure, the third mask plate 230 further comprises a third mask plate masking area 234 and a third mask frame 236, the precision mask area 232 and the third mask plate masking area 234 are alternately arranged, the third mask frame 236 carries the third mask plate masking area 234, and a boundary of the precision mask area 232 is greater than a boundary of the display area 110. In details, in an embodiment of the present disclosure, the boundary of the precision mask area 232 extends 5 μm to 500 μm toward the boundary of the display area 110. The third mask plate masking area 234 is fixed on the third mask frame 236 by laser spot welding. The size of the third mask frame 236 is determined by the size of the third mask plate masking area 234. Specifically, in an embodiment of the present disclosure, a precision masking scheme of the third mask plate 230 is determined according to the specific design. The size, position, and opening scheme of the precision mask area 232 are determined by the size, position, and pixel design of an opening of a under-screen module in a panel AA area. It can be, but not limited to, the design of a precision metal mask scheme provided at a top of the panel, at a corner of the panel, and in a middle of the panel, as shown in FIG. 6, FIG. 7, and FIG. 8.

In an embodiment of the present disclosure, a thickness of the first mask plate, a thickness of the second mask plate, and a thickness of the third mask plate range from 0.01 mm to 0.2 mm.

In summary, the embodiments of the present disclosure provide a metal mask plate group for evaporation of a flexible OLED panel supporting under-screen module and a method of use thereof. In the embodiments of the present disclosure, after the mask plate group is matched and designed, a thickness of the cathode of the imaging area under the screen can be selectively reduced. The metal mask plate group comprises at least two metal mask plates. One metal mask plate (the first mask plate 210) can cover the entire of the display area (active area, AA), and another metal mask plate (the second mask plate 220) can cover all AA area expect an imaging area under the screen. With this type of design, a simple metal mask plate design and combination can be used to increase transmittance of the OLED panel in the imaging area under the screen. The embodiments of the present disclosure provide a metal mask plate group, which comprises at least three mask plates. A first mask plate 210 (mask 1), a second mask plate 220, and a third mask plate 230 (Mask 3) are used together for a cathode evaporation process. The metal mask plate group includes a metal frame carrying a mask plate. According to a design of a substrate used on the mask plate, there are a corresponding number and arrangement of mask plates on a distribution area of the panel. The corresponding evaporation area of the metal mask plate group can cover the entire AA area of the display of the panel. Thicknesses of different areas of the cathode in the same panel are different.

Figure 9:
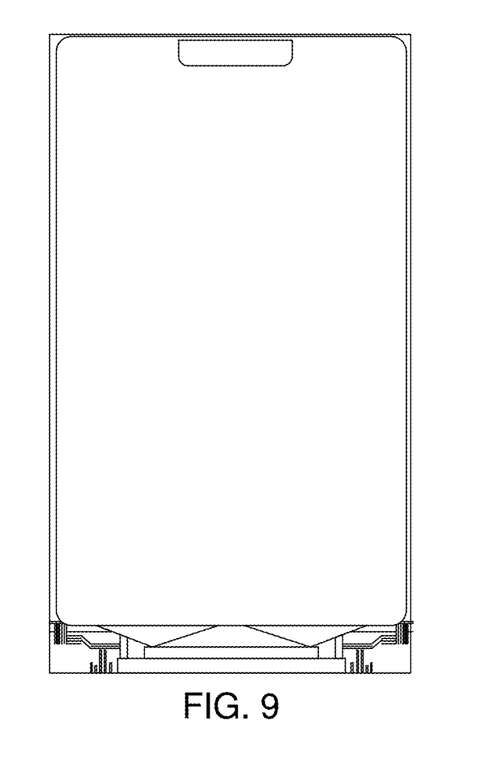
FIG. 9 is a schematic structural diagram of a mask plate group of an OLED panel according to an embodiment of the present disclosure.
Figure 10:
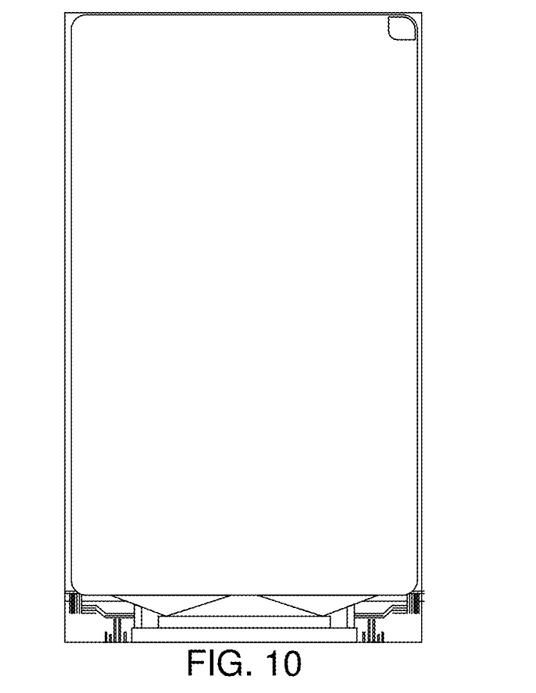
FIG. 10 is a schematic structural diagram of a mask plate group of an OLED panel according to an embodiment of the present disclosure.
Figure 11:
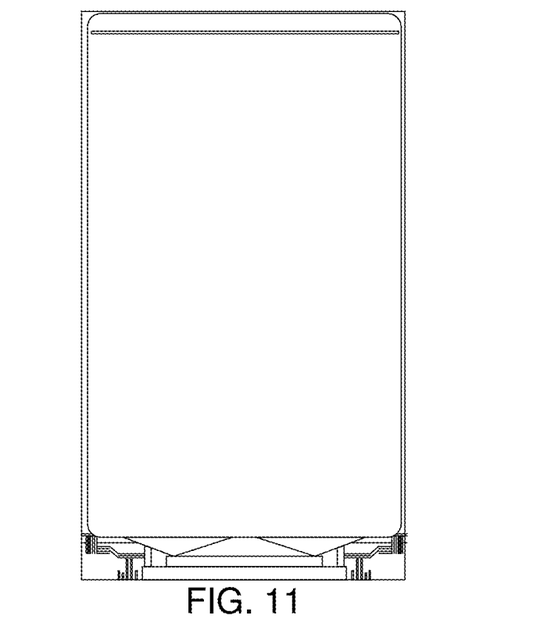
FIG. 11 is a schematic structural diagram of a mask plate group of an OLED panel according to an embodiment of the present disclosure.

In one embodiment of the present disclosure, an evaporation overlay pattern of a special-shaped mask area designed by Mask 1 and Mask 2 can cover all areas of the AA area of the panel. The cathode evaporation area passing through the opening of Mask 1 is the AA area of the entire panel. The cathode evaporation area using Mask 2 is all area except the imaging design area under the screen in panel AA. Using Mask 3's cathode evaporation area can cover only all the pixel opening in the imaging design area under the screen in the panel's AA area, as shown in FIG. 9, FIG. 10, and FIG. 11.

In one embodiment of the present disclosure, in the cathode evaporation process, Mask 1, Mask 2, and Mask 3 form a corresponding complete continuous cathode film layer on the same substrate. This can realize a design in which the thickness of the cathode in the under-screen imaging area of the panel's AA area is reduced and the thickness of the cathode in the non-under-screen imaging area is unchanged. In addition, micro-cavity effect compensation can also be performed on the OLED device in the under-screen imaging area. This can selectively reduce the thickness of the cathode film in some areas of the AA area of the panel and increase transmittance of the substrate in the under-screen imaging area. Too much impact on a display performance and effect of the entire panel is as shown in FIG. 2.

In one embodiment of the present disclosure, an opening boundary of an overlap between Mask 1 and Mask 2 is generally located at a PDL gap of the panel, and an opening edge design will be designed according to a pixel arrangement. Different opening edge designs can be made with different PDL gap designs, not necessarily smooth straight edge. Opening size of Mask 3 can cover one or more sub-pixels according to the design and extend 0 μm to 20 μm outside the sub-pixels.

In one embodiment of the present disclosure, the mask plate group 200 can be constructed by electroforming, etching, metal wire drawing, or laser ablation. The size of the mask plate group 200 is determined by the size of the substrate used. The corresponding size of the mask plate group 200 is used for the substrate with the corresponding size.

Figure 12:
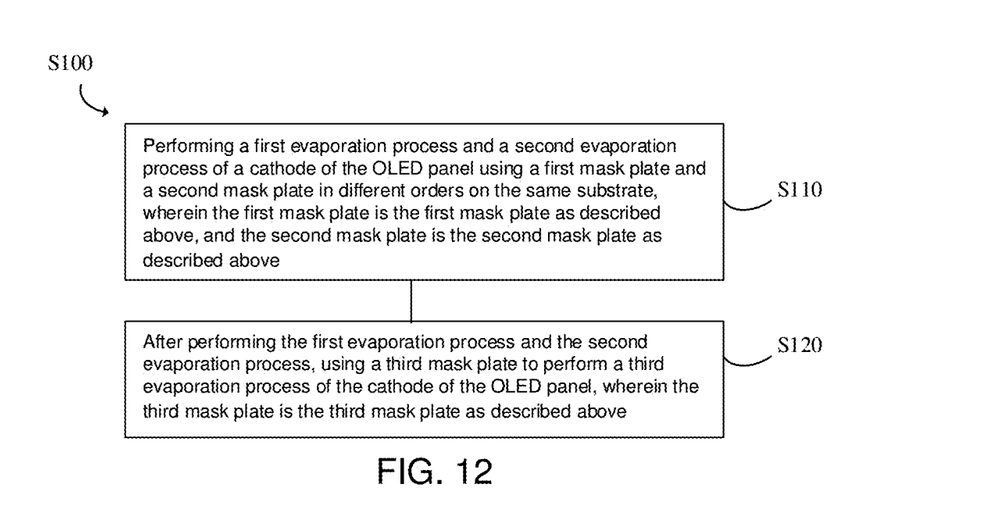
FIG. 12 is a schematic flowchart of an evaporation method of an OLED panel according to an embodiment of the present disclosure.

Referring to FIG. 12, FIG. 12 is a schematic flowchart of an evaporation method of an OLED panel according to an embodiment of the present disclosure. An embodiment of the present disclosure provides an evaporation method S100 of an OLED panel. The evaporation method S100 of the OLED panel comprises: Step S110: performing a first evaporation process and a second evaporation process of a cathode of the OLED panel using a first mask plate and a second mask plate in different orders on the same substrate, wherein the first mask plate is the first mask plate as described above, and the second mask plate is the second mask plate as described above. The embodiments of the present disclosure can increase transmittance of the imaging area.

In an embodiment of the present disclosure, the evaporation method S100 of the OLED panel further comprises: Step S120: after performing the first evaporation process and the second evaporation process, using a third mask plate to perform a third evaporation process of the cathode of the OLED panel, wherein the third mask plate is the third mask plate as described above.

In details, in an embodiment of the present disclosure, the first evaporation process comprises using the first mask plate to vaporize a first cathode having a first thickness in the entire of the display area having the imaging area of the OLED panel; the second evaporation process comprises using the second mask plate to vaporize a second cathode having a second thickness in all the display area except the imaging area of the OLED panel, a thickness of the cathode in the imaging area is less than a thickness of the cathode in all the display area except the imaging area; and the third evaporation process comprises using the third mask plate to vaporize a third cathode having a third thickness in the pixel opening of the imaging area of the OLED panel.

In details, in an embodiment of the present disclosure, a sequence of the first evaporation process is earlier than a sequence of the second evaporation process. In details, in another embodiment of the present disclosure, a sequence of the second evaporation process is earlier than a sequence of the first evaporation process. In details, in an embodiment of the present disclosure, the evaporation method of the OLED panel further comprises using three different sheets of the first mask plate, the second mask plate, and the third mask plate to vaporize different areas of the display area at least three times, wherein the first thickness of the first cathode in the first evaporation process ranges from 50 Å to 120 Å, the second thickness of the second cathode in the second evaporation process ranges from 20 Å to 130 Å, the third thickness of the third cathode in the third evaporation process ranges from 20 Å to 130 Å, a thickness of the cathode of all the display area except the imaging area ranges from 70 Å to 250 Å, a thickness of the cathode of a non-pixel opening area of the imaging area of the display area ranges from 50 Å to 120 Å, and a thickness of the cathode of the pixel opening of the imaging area ranges from 70 Å to 250 Å.

Figure 13:
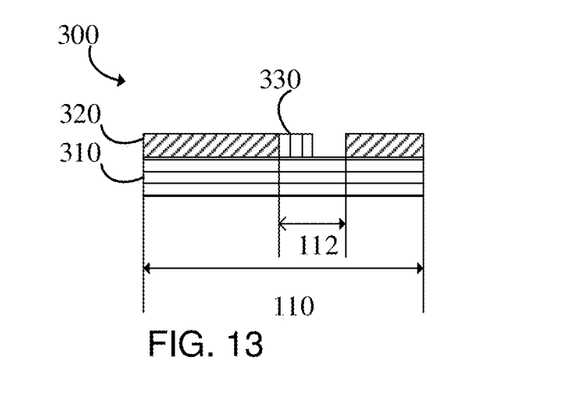
FIG. 13 is a schematic structural diagram of a cathode structure of an OLED panel according to an embodiment of the present disclosure.

Referring to FIG. 13, FIG. 13 is a schematic structural diagram of a cathode structure of an OLED panel according to an embodiment of the present disclosure. In embodiment of the present disclosure, a cathode structure 300 of an OLED panel comprises a display area 110 having an imaging area 112, a first cathode 310 having a first thickness fully disposed on the display area 110, and a second cathode 320 having a second thickness disposed on all the display area 110 except the imaging area 112. The embodiments of the present disclosure can increase transmittance of the imaging area 112.

In details, in an embodiment of the present disclosure, the cathode structure 300 of the OLED panel further comprises a third cathode 330 having a third thickness disposed on the pixel opening 1122 of the imaging area 112.

In details, in an embodiment of the present disclosure, the first thickness of the first cathode 310 ranges from 50 Å to 120 Å, the second thickness of the second cathode 320 ranges from 20 Å to 130 Å, and the third thickness of the third cathode 330 ranges from 20 Å to 130 Å. In details, in an embodiment of the present disclosure, a thickness of the cathode of all the display area 110 except the imaging area 112 ranges from 70 Å to 250 Å, a thickness of the cathode of a non-pixel opening area of the imaging area 112 of the display area 110 ranges from 50 Å to 120 Å, and a thickness of the cathode of the pixel opening 1122 of the imaging area 112 ranges from 70 Å to 250 Å.

In details, in an embodiment of the present disclosure, material of the cathode structure 300 may be, but not limited to, composed of Ag/Mg alloy in different ratios, and a ratio of Mg content to the Ag/Mg alloy ranges from 0% to 95%.

In summary, the embodiments of the present disclosure provide a novel metal mask plate and cathode manufacturing method for evaporation of a flexible OLED panel. By designing several matching metal mask plates with different shielding areas. The cathode evaporation is performed on the same substrate in sequence, and the imaging area under the screen can be completely shielded during the second evaporation. This reduces the thickness of the cathode in the area where the camera is located, improves the transmittance in this area, and does not affect the thickness of the cathode in the normal AA area of the panel. Then, use a precision metal mask plate for the third evaporation to compensate for the thickness of the cathode film on the pixel opening in the imaging design area under the screen. The metal mask plate of this design can overcome the difficulty of shielding in the middle of the AA area of the panel. Through, simple design and improvement, the evaporation process method in which the cathode in the camera or the opening of call module under the screen is shielded is realized, and finally the real under-screen camera design.

In one embodiment of the present disclosure, the cathode evaporation process uses matching Mask1 and Mask2, and the cathode evaporation process is sequentially performed on the same substrate. Mask can be used in accordance with the use of Mask1 to make the AA area of the panel fully vaporize a part of the cathode, and then use Mask2 to vaporize the special-shaped area. This makes the cathode thickness of the imaging design area under the screen thinner than the normal area of the AA area of the panel. Finally, Mask 3 is used to compensate the thickness of the cathode on the pixel opening of the imaging area under the screen. Mask 2 is also used to vaporize the special-shaped pattern, then Mask1 is used to fully vaporize the AA area of the panel, and finally Mask 3 is used to compensate the thickness of the cathode on the pixel opening of the imaging area under the screen.

In one embodiment of the present disclosure, the cathode evaporation process uses at least three different Masks to vaporize different areas in the AA area of the panel. The thickness of the cathode for the first evaporation is 50 to 120 Å. The thickness of the cathode in the second evaporation is 20 to 130 Å. The thickness of the cathode for the third evaporation is 20 to 130 Å. That is, the normal area of the AA area of the panel has a cathode thickness of 70 to 250 Å. The cathode thickness of the non-pixel opening area of the imaging area under the screen in the AA area of the panel is 50 to 120 Å. The cathode thickness of the pixel opening area of the imaging area under the screen is 70-250 Å.

In summary, the embodiments of the present disclosure provide a cathode evaporation method that can improve the light transmittance of the under-screen imaging area of the full screen of the OLED, which is used for the manufacture of the cathode of the full screen OLED light emitting device. The specific operations and equipment used are as follows:

Step 1: Introduce a metal mask plate, Mask 1, used for a cathode to an inside of a corresponding machine cavity.

Step 2: A substrate completes a pre-cathode evaporation process and is transferred into a cathode evaporation chamber, MC 1.

Step 3: Adjust an alignment of Mask 1 and the substrate. Align the deviation substrate and complete the alignment by CCD, and the metal mask plate and the substrate are closely attached in the cavity.

Step 4: The substrate completes a first OLED cathode evaporation process. The cathode forms a film through an opening area of Mask 1. The cathode film layer covers all positions of the AA area of the panel. The thickness of the coating is 50-120 Å. Then transfer to another cathode evaporation chamber MC 2 (multi-chamber design) or replace Mask 1 with Mask 2 (single-chamber design).

Step 5. Adjust an alignment of Mask 2 and the substrate. Align the deviation substrate and complete the alignment by CCD. In the cavity, the metal mask plate is closely attached to the substrate, and the second OLED cathode evaporation process is started.

Step 6: The substrate completes the second OLED cathode evaporation process. The cathode forms a film through the opening area of Mask 2. During the second cathode evaporation, no cathode film was formed in the imaging area under the screen of the AA area of the panel. The thickness of the cathode in the second evaporation is 20 to 130 Å. Then transfer to the next process. The cathode thickness of the normal area of the AA area of the panel after the second evaporation is 70 to 250 Å. The cathode thickness of the imaging area under the screen in the AA area of the panel is 50 to 120 Å.

Step 7. After completing the second OLED cathode evaporation process, the substrate is transferred to the third cathode evaporation chamber MC 3 (multi-chamber design), or Mask 2 is replaced with Mask 3 (single-chamber design). Mask 3 is aligned with the substrate that has completed the second cathode evaporation and compensates for the cathode thickness of the pixel opening area of the imaging area under the screen. The thickness of the cathode for the third evaporation is 20 to 130 Å. That is, the cathode thickness in the normal area of the AA area of the panel is 70 to 250 Å. The thickness of the cathode in the non-pixel opening area of the imaging area under the screen in the AA area of the panel is 50 to 120 Å. The cathode thickness of the pixel opening area of the imaging area under the screen is 70 to 250 Å.

In one embodiment of the present disclosure, material of this set of metal masks is usually Invar alloy, which can also be made of SUS alloy or other types of alloys. This set of metal masks is used for cathode evaporation in the evaporation process of manufacturing full-screen OLED display devices. Through the CCD alignment, the mask 1 of the metal mask and the substrate are aligned. This aligns the opening area of Mask1 with the corresponding panel coating area to complete the first cathode coating. In the same cavity, replace Mask 1 with Mask 2, and then align the CCD again to align the opening area of Mask 2 with the corresponding panel coating area to complete the second coating. Subsequently, Mask 2 is replaced with Mask 3 in the same chamber, and after the CCD alignment, the third evaporation is performed. The cathode pattern coated three times can be superimposed on the instrument in the AA area of the panel. The thickness of the cathode in the normal area of the AA area of the panel after the third cathode evaporation is 70 to 250 Å. The cathode thickness of the non-pixel opening area of the imaging area under the screen in the AA area of the panel is 50 to 120 Å. The cathode thickness of the pixel opening area of the imaging area under the screen is 70 to 250 Å.

After the cathode preparation is completed, the substrate can be introduced into a TFE process machine for a thin film packaging process.

In one embodiment of the present disclosure, the steps actually used in the cathode evaporation process are as follows:

1. First, Mask 1 of the metal mask plate is transferred from Mask Stock with a mechanical arm and placed on the Mask lifting device of the chamber corresponding to the cathode of the evaporation.

2. The substrate transferred into a machine table is placed on a lifting claw carrying the substrate to ensure that the substrate is stably placed on the lifting claw of a machine board carrier device.

3. A substrate holding device is lowered and a PIN is used on an edge of a substrate carrier (for small-size Mask) or CCD and Mask 1 to complete the alignment, so that the opening area of the mask plate corresponds to the position of the panel to be coated.

4. Make use of gravity of the substrate itself, a pressure exerted by a platform and attraction of a machine's magnetic plate to make Mask closely adhere to the substrate, and then start the OLED evaporation process to complete the first evaporation of the cathode on a surface of the panel.

5. Replace Mask 1 with Mask 2 and repeat steps 1 to 4 above.

6. Replace Mask 2 with Mask 3, and repeat steps 1 to 4 to complete the cathode evaporation process.

7. After the two cathode evaporation processes in the chamber are completed, the substrate holding device slowly raises the substrate and separates it from the mask plate. The designated area on the substrate is coated and transferred to the next stage of the process.

In summary, the disclosed embodiments provide at least one of the following beneficial effects.

1. The design of the evaporation cathode mask plate can be changed to solve issues that light transmission rate of the cathode in the corresponding imaging design area under the screen is too low in the existing full-screen OLED panel manufacturing process that supports the camera under the screen.

2. From the evaporation process, the cathode of the specified area is thinned, the subsequent laser ablation process in the existing manufacturing process is omitted, and risk of laser ablation on the yield loss of the panel is avoided.

3. Use FMM to correct the thickness of the cathode at the pixel opening, without reducing transmittance of the imaging design area under the screen and ensuring that the micro-cavity effect of the OLED device will not be weakened. Therefore, transmittance of the imaging design area under the screen can be improved without greatly reducing efficiency of the OLED device.

4. The existing production line can complete the production of a full screen supporting the camera under the screen without adding equipment and changing the structure of the production line, which can reduce equipment procurement and maintenance costs.

In summary, the embodiments of the present disclosure provide a novel metal mask plate and cathode manufacturing method for evaporation of a flexible OLED panel. Through the design of a set of special-shaped metal mask plate, and combined application in the evaporation cathode process. This overcomes issues that the evaporation of the cathode causes transmittance of the OLED panel to decrease. Through simple design and improvement, the cathode of the designated area of the imaging design area under the screen of the panel is thinned. Compared to the prior art, the light transmittance of the designated area of the OLED panel is improved.

In an OLED panel, an evaporation method thereof, and a mask plate group thereof, the mask plate group comprises a first mask plate and a second mask plate. The first mask plate comprises a common mask opening area. The common mask opening area covers an entire of the display area. The second mask plate comprises a special-shaped mask opening area. The special-shaped mask opening area covers all the display area except the imaging area. The evaporation method of the OLED panel comprises performing a first evaporation process and a second evaporation process of a cathode of the OLED panel using a first mask plate and a second mask plate in different orders on the same substrate. The first mask plate is the first mask plate as described above, and the second mask plate is the second mask plate as described above. The cathode structure of the OLED panel comprises a display area having an imaging area, a first cathode having a first thickness fully disposed on the display area, and a second cathode having a second thickness disposed on all the display area except the imaging area. The embodiments of the present disclosure can increase transmittance of the imaging area.

Also, although the present disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components, the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

The above are only the preferred embodiments of the present disclosure. It should be noted that for those of ordinary skill in the art, without departing from the principles of the present disclosure, a number of improvements and modifications can be made. These improvements and modifications should also be regarded as the protection scope of the present disclosure.

What is claimed is:

1. A mask plate group of an organic light emitting diode (OLED) panel, wherein the OLED panel comprises a display area having an imaging area, and the mask plate group comprises:

a first mask plate comprising a common mask opening area, and the common mask opening area covering an entire of the display area;

a second mask plate comprising a special-shaped mask opening area, and the special-shaped mask opening area covering all the display area except the imaging area; and a third mask plate comprising a precision mask area, the precision mask area covering an entire of the imaging area, and an opening of the precision mask area corresponding to a pixel opening of the imaging area.

2. The mask plate group of the OLED panel according to Claim 1, wherein the third mask plate further comprises a third mask plate masking area and a third mask frame, the precision mask area and the third mask plate masking area are alternately arranged, the third mask frame carries the third mask plate masking area, and a boundary of the precision mask area is greater than a boundary of the display area.

3. The mask plate group of the OLED panel according to claim 2, wherein the boundary of the precision mask area extends 5 μm to 500 μm toward the boundary of the display area.

4. The mask plate group of the OLED panel according to Claim 1, wherein a thickness of the first mask plate, a thickness of the second mask plate, and a thickness of the third mask plate range from 0.01 mm to 0.2 mm.

5. The mask plate group of the OLED panel according to claim 1, wherein the first mask plate further comprises a first mask plate masking area and a first mask frame, the common mask opening area and the first mask plate masking area are arranged alternately, the first mask frame carries the first mask plate masking area, and an area of the common mask opening area is greater than an area of the entire of the display area.

6. The mask plate group of the OLED panel according to claim 5, wherein a size of the common mask opening area extends 5 μm to 500 μm to all boundaries of the display area.

7. The mask plate group of the OLED panel according to claim 1, wherein the second mask plate further comprises a second mask plate masking area and a second mask frame, the special-shaped mask opening area and the second mask plate masking area are alternately arranged, the second mask frame carries the second mask plate masking area, and three boundaries of the special-shaped mask opening area are greater than three boundaries of the display area.

8. The mask plate group of the OLED panel according to claim 7, wherein the three boundaries of the special-shaped mask opening area extend 5 μm to 500 μm toward the three boundaries of the display area.

9. An evaporation method of an OLED panel, comprising:
performing a first evaporation process and a second evaporation process of a cathode of the OLED panel using a first mask plate and a second mask plate in different orders on the same substrate, wherein the first mask plate comprises a common mask opening area, the common mask opening area covers an entire of a display area, the second mask plate comprises a special-shaped mask opening area, and the special-shaped mask opening area covers all the display area except an imaging area.

10. The evaporation method of the OLED panel according to claim 9, further comprising after performing the first evaporation process and the second evaporation process, using a third mask plate to perform a third evaporation process of the cathode of the OLED panel, wherein the third mask plate comprises a precision mask area, the precision mask area covers an entire of the imaging area, and an opening of the precision mask area corresponds to a pixel opening of the imaging area.

11. The evaporation method of the OLED panel according to claim 10, wherein the first evaporation process comprises using the first mask plate to vaporize a first cathode having a first thickness in the entire of the display area having the imaging area of the OLED panel; the second evaporation process comprises using the second mask plate to vaporize a second cathode having a second thickness in all the display area except the imaging area of the OLED panel, a thickness of the cathode in the imaging area is less than a thickness of the cathode in all the display area except the imaging area; and the third evaporation process comprises using the third mask plate to vaporize a third cathode having a third thickness in the pixel opening of the imaging area of the OLED panel.

12. The evaporation method of the OLED panel according to claim 11, wherein a sequence of the first evaporation process is earlier than a sequence of the second evaporation process.

13. The evaporation method of the OLED panel according to claim 11, wherein a sequence of the second evaporation process is earlier than a sequence of the first evaporation process.

14. The evaporation method of the OLED panel according to claim 11, further comprising using three different sheets of the first mask plate, the second mask plate, and the third mask plate to vaporize different areas of the display area at least three times, wherein the first thickness of the first cathode in the first evaporation process ranges from 50 Å to 120 Å, the second thickness of the second cathode in the second evaporation process ranges from 20 Å to 130 Å, the third thickness of the third cathode in the third evaporation process ranges from 20 Å to 130 Å, a thickness of the cathode of all the display area except the imaging area ranges from 70 Å to 250 Å, a thickness of the cathode of a non-pixel opening area of the imaging area of the display area ranges from 50 Å to 120 Å, and a thickness of the cathode of the pixel opening of the imaging area ranges from 70 Å to 250 Å.

15. An OLED panel, comprising:
a cathode structure comprising:
a display area having an imaging area;
a first cathode having a first thickness fully disposed on the display area; a second cathode having a second thickness disposed on all the display area except the imaging area; and
a third cathode having a third thickness disposed on the pixel opening of the imaging area.

16. The OLED panel according to Claim 15, wherein the first thickness of the first cathode ranges from 50 Å to 120 Å, the second thickness of the second cathode ranges from 20 Å to 130 Å, and the third thickness of the third cathode ranges from 20 Å to 130 Å.

17. The OLED panel according to Claim 15, wherein a thickness of the cathode of all the display area except the imaging area ranges from 70 Å to 250 Å, a thickness of the cathode of a non-pixel opening area of the imaging area of the display area ranges from 50 Å to 120 Å, and a thickness of the cathode of the pixel opening of the imaging area ranges from 70 Å to 250 Å.

18. The OLED panel according to claim 15, wherein material of the cathode structure is composed of Ag/Mg alloy in different ratios, and a ratio of Mg content to the Ag/Mg alloy ranges from 0% to 95%.

* * * * *